United States Patent
Hansen et al.

(10) Patent No.: US 12,140,339 B2
(45) Date of Patent: Nov. 12, 2024

(54) FILTER ISOLATION FOR EQUIPMENT FRONT END MODULE

(71) Applicant: APPLIED MATERIALS, INC., Santa Clara, CA (US)

(72) Inventors: James Christopher Hansen, Sunnyvale, CA (US); Steven Trey Tindel, Austin, TX (US); Paul B. Reuter, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 107 days.

(21) Appl. No.: 18/046,290

(22) Filed: Oct. 13, 2022

(65) Prior Publication Data
US 2024/0125491 A1    Apr. 18, 2024

(51) Int. Cl.
| | |
|---|---|
| *F24F 3/16* | (2021.01) |
| *B01D 46/00* | (2022.01) |
| *B01D 50/00* | (2022.01) |
| *F24F 3/163* | (2021.01) |
| *H01L 21/67* | (2006.01) |
| *H01L 21/673* | (2006.01) |

(52) U.S. Cl.
CPC ............ *F24F 3/163* (2021.01); *B01D 46/00* (2013.01); *B01D 50/00* (2013.01); *H01L 21/67389* (2013.01)

(58) Field of Classification Search
CPC .... H01L 21/67389; B01D 46/00; B01D 50/00
See application file for complete search history.

(56) References Cited

U.S. PATENT DOCUMENTS

| | | | |
|---|---|---|---|
| 11,133,208 B2 * | 9/2021 | Okabe | H01L 21/67742 |
| 2018/0286715 A1 | 10/2018 | Sakurabayashi et al. | |
| 2019/0326134 A1 | 10/2019 | Suzuki et al. | |
| 2020/0312686 A1 | 10/2020 | Kawai et al. | |
| 2022/0310412 A1 | 9/2022 | Chang et al. | |

FOREIGN PATENT DOCUMENTS

| | | | |
|---|---|---|---|
| CN | 110277331 A | 9/2019 | |
| WO | WO-0155628 A1 * | 8/2001 | F16K 1/10 |

OTHER PUBLICATIONS

International Search Report and Written Opinion for International Application No. PCT/US2023/034847, mailed Jan. 26, 2024, 8 Pages.

* cited by examiner

*Primary Examiner* — Robert A Hopkins
(74) *Attorney, Agent, or Firm* — Lowenstein Sandler LLP

(57) ABSTRACT

Disclosed herein are systems and methods for reducing startup time of an equipment front end module (EFEM). The EFEM may include an EFEM chamber formed between a plurality of walls, an upper plenum above the EFEM chamber, the upper plenum in fluid communication with the EFEM chamber, a plurality of ducts that provide a return gas flow path enabling recirculation of gas from the EFEM chamber to the upper plenum, one or more filters that separate the upper plenum from the EFEM chamber, an isolation gate configured to block the return gas flow path responsive to the isolation gate being actuated to a closed position to isolate the one or more filters from an ambient environment responsive to a gas being flowed through the upper plenum when the EFEM chamber is opened to the ambient environment.

20 Claims, 6 Drawing Sheets

FILTER ISOLATION FOR EQUIPMENT FRONT END MODULE

FIELD

The present disclosure relates to electronic device manufacturing, and more specifically to equipment front end modules (EFEMs).

BACKGROUND

Processing substrates in semiconductor electronic device manufacturing is generally carried out in multiple process tools, where substrates travel between process tools in substrate carriers. A substrate carrier may be docked at a load port of an equipment front end module (EFEM), sometimes referred to as a factory interface (FI), where one or more substrates are transferred to a load lock, a transfer chamber and/or a process chamber. Pre- and post-substrate exposure to moisture and oxygen can cause on substrate corrosion (e.g., etch), interlayer defects (e.g., film stress and resistivity, physical vapor deposition) and device non-uniformity (e.g., chemical vapor deposition passivation). Eliminating moisture and oxygen from the EFEM environment reduces and/or eliminates such device performance and yield challenges.

Some EFEMs provide a non-reactive environment for transferring substrates between the substrate carriers and the load lock and/or chamber. This is achieved by sealing the interior volume of the EFEM as much as is practical and flooding the interior volume with a gas such as nitrogen that is generally non-reactive with substrate materials. The non-reactive gas forces out any reactive gases such as oxygen from the EFEM and also reduces/eliminates moisture from the EFEM. One or more load ports for docking to one or more substrate carriers may be arranged along a front face of the EFEM. The load ports of conventional EFEMs are bottom purged with an inert gas to reduce the relative humidity (RH) and oxygen levels within the substrate carrier and EFEM during substrate processing and transport.

When EFEMs are opened to an ambient environment, such as during maintenance of the EFEM, the interior of the EFEM is exposed to the ambient environment. The ambient environment generally has a relative humidity that may be 30-40 times greater than the relative humidity under which the EFEM generally operates. EFEMs may include filters that absorb moisture from the ambient environment when the EFEMs are open to the ambient environment. Once maintenance of the EFEM is completed and it is closed back up, a requalification process is generally performed before the EFEM can be returned to service. Due to the filters of the EFEM having absorbed moisture while the interior of the EFEM was exposed to the ambient environment, the requalification process can take over 24 hours, during which the moisture absorbed by the filters is slowly removed. Such long requalification processes can be costly to owners, as product is not processed until the requalification process is complete.

BRIEF SUMMARY

Disclosed herein according to one or more embodiments, is an equipment front end module (EFEM) including an EFEM chamber formed between a plurality of walls of the EFEM, and an upper plenum above the EFEM chamber. The upper plenum is in fluid communication with the EFEM chamber. The EFEM further includes multiple ducts that provide a return gas flow path enabling recirculation of gas form the EFEM chamber to the upper plenum. The EFEM further includes one or more filters that separate the upper plenum from the EFEM chamber. The EFEM further includes an isolation gate configured to block the return gas flow path responsive to the isolation gate being actuated to a closed position. While the isolation gate is in the closed position, the one or more filters are isolated from an ambient environment responsive to a gas being flowed through the upper plenum when the EFEM chamber is opened to the ambient environment.

A method of servicing an equipment front end module (EFEM) includes providing the EFEM which includes an upper plenum in fluid communication with an EFEM chamber via one or more filters and multiple ducts that provide a return gas flow path enabling recirculation of gas from the EFEM chamber to the upper plenum. The method further includes opening the EFEM chamber to an external ambient environment and closing an isolation gate to block the return gas flow path. The method further includes flowing a gas through a gas inlet of the upper plenum and through the one or more filters while the EFEM chamber is opened to the external ambient environment, preventing moisture from the ambient environment from being absorbed by the one or more filters. The method further includes closing the EFEM chamber to the external ambient environment and opening the isolation gate to un-block the return gas flow path.

An isolation gate of an equipment front end module (EFEM) includes a body having dimensions that approximately correspond to dimensions of a sidewall of an upper plenum of the EFEM. The isolation gate further includes one or more seals coupled to a side surface of the body. The one or more seals are configured to seal corresponding openings in the sidewall of the upper plenum at a peripheral edge of the corresponding openings. The isolation gate is configured to block a return gas flow path of the EFEM responsive to the isolation gate being actuated to a closed position in the EFEM.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Figure 1:
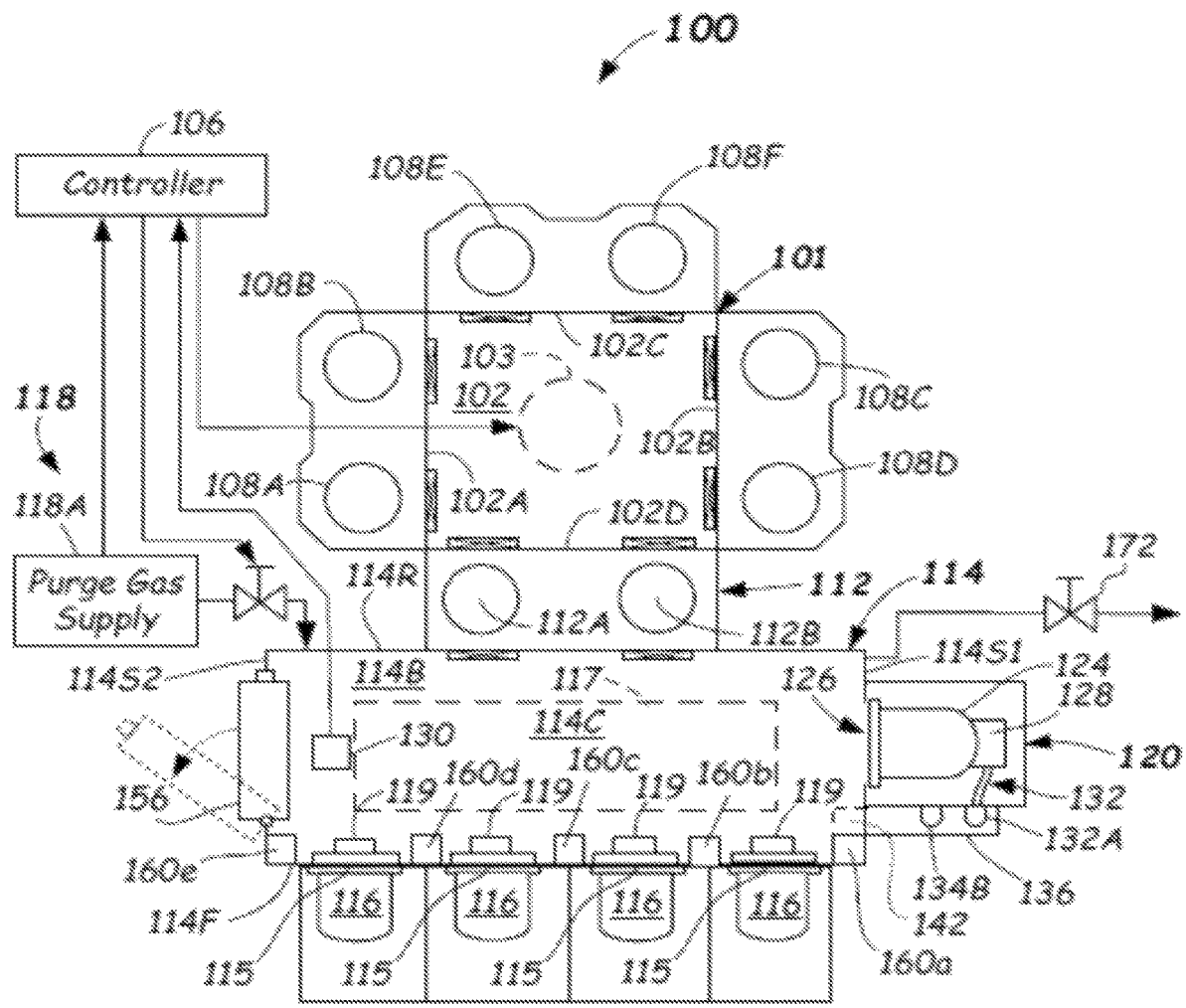
FIG. 1 illustrates a schematic top view of an electronic device manufacturing assembly according to one or more embodiments of the disclosure.

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Described herein are embodiments of an EFEM that is configured to isolate one or more filters of the EFEM from an ambient environment during servicing of the EFEM to reduce startup time after such servicing. During servicing of the EFEM, the EFEM may be opened up and an interior of the EFEM may be exposed to a relatively high humidity ambient environment. In particular, during service and/or startup of the EFEM, one or more filters within the EFEM may be exposed to relatively high relative humidity (RH) ambient gas (e.g., ambient air). The humidity is present in the ambient environment, and adheres to all surfaces exposed to the ambient environment. In particular, moisture from the ambient environment can adsorb into the filter media such that when the EFEM begins operation (which may include circulating a low RH inert gas through the interior of the EFEM), the system can take a substantial amount of time to reach target RH levels (e.g., such as 24 hours or more). Before the EFEM is ready to operate on product, the adsorbed moisture should first be desorbed from all surfaces, including from the filters. As a result, the time that it takes to return the EFEM to low humidity levels used for operations of product depends on the amount of time its internal components were exposed to relatively high humidity of an ambient environment such as during a startup or maintenance recovery. Isolation of the one or more filters in an EFEM from an ambient environment while the EFEM is open to the ambient environment creates an effective way to keep the filter media of the EFEM dry and unexposed to higher ambient RH levels of the ambient environment. This can be accomplished by closing an isolation gate in the EFEM to block a return gas flow path between the EFEM chamber and the upper plenum of the EFEM, and flowing a purge gas (e.g., a low humidity gas such as low RH xCDA) through an inlet in the upper plenum and toward the filter media. This creates a positive flow of purge gas through the filter media while the interior of the EFEM is open to the ambient environment, preventing or reducing moisture from the ambient air from contacting the filter media.

Known recirculating EFEM's do not have the ability to isolate the filter media to keep it dry when open to an ambient environment having relative high RH. For example, if the EFEM is being serviced, the filter will be exposed to the ambient air within a semiconductor fabrication plant. Typically, this ambient air has an RH of about 25% to about 50%, or about 30% to about 40%, or about 38%. During this service, the filters are exposed to that same high level of humidity, whereas before maintenance (in the case of a service) the filters may be operating at below about 1% RH, which may be the operational target. The EFEM doors may be opened during maintenance to enable access to the interior components of the EFEM. A service could be performed for a short amount of time (e.g., about 30 minutes), or may be performed for a long amount of time (e.g., about 8 to about 10 hours). The longer the filters are exposed to the higher RH level of the ambient air, the higher the moisture content adsorbed onto the filter media, and thus the longer it takes to reduce the RH level within the EFEM once it is sealed back up.

EFEMs according to one or more embodiments described herein include an isolation gate that, together with a flow of inert gas, isolate the one or more filters of the EFEMs from an ambient environment and maintain the flow of inert gas through one or more filters of the EFEM while the EFEM is open to the ambient environment. The isolation gate may be configured to block a return gas flow path between the EFEM chamber and an upper plenum of the EFEM while the isolation gate is in a closed position. A positive pressure may be achieved (i.e., induced) in the upper plenum responsive to the supply of inert gas to the upper plenum. In some embodiments, the EFEM may be configured to flow the gas through the filters responsive to the positive pressure. Suitable inert, low RH gases include, but are not limited to, nitrogen ($N_2$), clean dry air (CDA), extreme clean dry air (xCDA), that is, CDA having a moisture content of less than about 0.33 ppm by weight, and so on. The inert gas may flow through the filter media isolates the filter media from the ambient air. The isolation gate may be opened after the EFEM is closed (e.g., subsequent to servicing). This can greatly reduce an amount of humidity absorbed or adsorbed by the one or more filters of the EFEM while the EFEM is open to the ambient environment. Accordingly, such systems and equipment provide for a faster startup and return to a low operational level of RH suitable for substrate processing than conventional EFEMs. EFEM's, according to one or more embodiments herein, return the RH of the inert gas to a baseline operational level as quickly as possible (e.g., on the order of minutes to a few hours), and much more quickly than standard EFEMs that do not include a closable isolation gate during maintenance. Ambient room air has a relatively high RH as compared to target RH levels during operation of the EFEM. When the one or more filters within the EFEM remain exposed to ambient air, moisture permeates the media and increases the time it takes to dry them out during startup. Filter media is inherently a large absorber of moisture. Keeping the filter media dry can greatly reduce startup time of the EFEM.

FIG. 1 illustrates a schematic diagram of an example embodiment of an electronic device manufacturing assembly 100 according to one or more embodiments of the present disclosure. The electronic device manufacturing assembly 100 may include a mainframe housing 101 having housing walls defining a transfer chamber 102. A transfer robot 103 (shown as a dotted circle) may be at least partially housed within the transfer chamber 102. The transfer robot 103 may be configured to place and remove substrates to and from various destinations via operation of arms (not shown) of the transfer robot 103. "Substrates" as used herein may refer to articles used to make electronic devices or circuit components, such as semiconductor wafers, silicon-containing wafers, patterned wafers, glass plates, and the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103. Suitable feedback mechanisms may be provided for one or more of the components by various sensors, such as position encoders, and the like.

The transfer chamber 102 as shown is square, but could be rectangular, hexagonal, octagonal, or another polygonal shape and may include a first wall 102A, second wall 102B, a third wall 102C, and a fourth wall 102D. In the embodiment shown, the transfer robot 103 can transfer and/or retract dual substrates at the same time. The first wall 102A, second wall 102B, third wall 102C, and fourth wall 102D may be planar and entryways into the sets of process chambers may lie along the respective walls. However, other suitable shapes of the mainframe housing 101, numbers of walls and process chambers, and types of robots are possible.

The destinations for the transfer robot 103 may be any one or more of the process chambers 108A-108F, which may be configured and operable to carry out a process on the substrates delivered thereto. The process may be any suitable process such as plasma vapor deposition (PVD) or chemical vapor deposition (CVD), etch, annealing, preclean, metal or metal oxide removal, and the like. Other processes may be carried out on substrates therein.

Substrates may be received into the transfer chamber 102 from an EFEM 114, and may exit the transfer chamber 102 to the EFEM 114, through a load lock apparatus 112, which is coupled to a rear wall 114R of the EFEM 114. The load lock apparatus 112 may include one or more load lock chambers (e.g., load lock chambers 112A and 112B) therein. Load lock chambers 112A and 112B may be single wafer load lock (SWLL) chambers, multi-wafer chambers, or combinations thereof. Other numbers of load locks may be included.

The EFEM 114 may be an enclosure having various enclosure walls, such as, e.g., front wall 114F, rear wall 114R, two side walls 114S1, 114S2, a top (not shown), and a bottom 114B, forming an EFEM chamber 114C. Each of the front 114F, rear 114R, and two side walls 114S1, 114S2 may have one or more interface openings to facilitate substrate exchange and/or coupling to other components. One or more load ports 115 may be provided on the front wall (not shown) of the EFEM 114 as shown in FIG. 1. The one or more load ports 115 may each be configured to receive and dock with a respective one or more substrate carrier 116 (e.g., FOUP). Although four load ports 115 and four substrate carriers 116 are shown, other embodiments may have more or fewer load ports 115 suitable for docking a respective number of substrate carriers 116 at the EFEM 114.

EFEM 114 may include a suitable load/unload robot 117 (shown dotted) of conventional construction within the EFEM chamber 114C thereof. The load/unload robot 117 may be configured and operational, once a carrier door of a substrate carrier 116 is opened via a carrier door opener 119 for each of the load ports 115, to extract substrates from the substrate carrier 116 and to feed the substrates through the EFEM chamber 114C and into the one or more load lock chambers 112A and 112B of the load lock apparatus 112.

Side storage pod 120 may be coupled to a sidewall 114S1 of the EFEM 114. In particular, the load/unload robot 117 may further be configured to extract substrates from and load substrates into the side storage pod 120 prior to and/or after processing in one or more of the process chambers 108A-108F. In some embodiments, the load/unload robot 117 is a high-Z robot configured to access substrates stacked 26 high, or even 52 high or higher, in the side storage pod 120.

In the embodiment shown, the EFEM chamber 114C may be provided with environmental controls providing an environmentally-controlled atmosphere therein. In particular, an environmental control apparatus 118 may be coupled to the EFEM 114 and may be operational to monitor and/or control environmental conditions within the EFEM chamber 114C. In some embodiments, and at certain times, the EFEM chamber 114C may receive a purge gas (e.g., an inert and/or non-reactive gas) therein, such as, e.g., argon (Ar), nitrogen ($N_2$), helium (He), clean dry air, or extreme clean dry air (xCDA) from purge gas supply 118A. The purge gas supply 118A may be coupled by suitable conduits and one or more valves to the EFEM chamber 114C. The environmental conditions within the EFEM chamber 114C may be within the interiors of side storage containers 124 located within and as part of the side storage pod 120. The side storage containers 124 receive substrates vertically stacked therein. In some embodiments, the side storage pod 120 may have substrate holders located therein to receive and support substrates.

In more detail, the environmental control system 118 may control at least one of: 1) relative humidity (RH), 2) temperature (T), 3) an amount of oxygen ($O_2$), and/or 4) an amount of purge gas, within the EFEM chamber 114C. Other environmental conditions of the EFEM 114 may be monitored and/or controlled, such as gas flow rate into the EFEM chamber 114C, or pressure within the EFEM chamber 114C, or both.

In some embodiments, environmental control system 118 includes controller 106.

Controller 106 may include suitable processor, memory, and electronic components for receiving inputs from various sensors and for controlling one or more valves to control the environmental conditions within the EFEM chamber 114C. Environmental control system 118 may, in one or more embodiments, monitor relative humidity (RH) by sensing RH in the EFEM 114 with a sensor 130. Any suitable type of sensor that measures relative humidity may be used, such as a capacitive-type sensor. The RH may be lowered by flowing a suitable amount of purge gas from the purge gas supply 118A of the environmental control system 118 into the EFEM chamber 114C. In some embodiments, compressed bulk inert gases having low $H_2O$ levels (e.g., purity ≥99.9995%, $H_2O$≤5 ppm) may be used as the purge gas supply 118A in the environmental control system 118, for example. Other suitably low $H_2O$ levels may be used.

In another aspect, the sensor 130 may measure a plurality of environmental conditions. For example, in some embodiments, the sensor 130 may measure the relative humidity value as discussed above. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device manufacturing assembly 100 or particular substrates exposed to the environment of the EFEM 114.

The environmental monitor (e.g., sensor 130) may also measure a level of oxygen ($O_2$) within the EFEM 114. In some embodiments, a control signal from the controller 106 to the environmental control apparatus 118 initiating a flow of a suitable amount of purge gas from the purge gas supply 118A into the EFEM chamber 114C may take place to control the level of oxygen ($O_2$) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device manufacturing assembly 100 or particular substrates exposed to the environment of the EFEM 114. In some embodiments, the sensor 130 may sense the level of oxygen in the EFEM chamber 114C to ensure it is above a safe threshold level to allow entry into the EFEM chamber 114C.

The sensor 130 may further measure the absolute or relative pressure within the EFEM 114. In some embodiments, the controller 106 may control the amount of flow of purge gas from the purge gas supply 118A into the EFEM chamber 114C to control the pressure in the EFEM chamber 114C.

In the embodiments shown herein, the controller 106 may include a processor, memory, and peripheral components configured to receive control inputs (e.g., relative humidity and/or oxygen) from the sensor 130 and to execute a closed loop or other suitable control scheme. In one embodiment, the control scheme may change a flow rate of the purge gas being introduced into the EFEM 114 to achieve a predetermined environmental condition therein. In another embodiment, the control scheme may determine when to transfer substrates into the EFEM 114 or when to open the door of the substrate carrier 116. In some embodiments, the controller 106 may control the opening and/or closing of gates included in the EFEM chamber 114C that direct the flow of purge gas through one or more filters included in the EFEM chamber 114C.

The side storage pod 120 attached to the EFEM 114 may store substrates under specific environmental conditions. For example, the side storage pod 120 may store the substrates in the same environmental conditions as are present in the EFEM chamber 114C, except the gas flow rate in the side storage pod 120 may be different, such as significantly greater. The side storage pod 120 may be fluidly coupled to the EFEM chamber 114C and may receive gas (e.g., purge gas) from the EFEM chamber 114C. The side storage pod 120 may include exhaust conduits 132 that exhaust gas from the side storage pod 120, which further enables the substrates stored in the side storage pod 120 to be constantly exposed to the desired environmental conditions and purge gas flow rate.

In some embodiments, the side storage pod 120 may receive one or more vertically-aligned side storage containers 124). For example, a first side storage container 124 may be received in the side storage pod 120. The first side storage container 124 may include an opening 126 that faces the EFEM chamber 114C. The first side storage container 124 may also include an exhaust plenum 128 located opposite the opening 126. The exhaust plenum 128 may be coupled to an exhaust conduit 132 that may couple between the exhaust plenum 128 and an exterior of the side storage pod 120.

The first exhaust conduit 132 may be made up of an internal portion and a first external portion 132A. A second conduit may be coupled between a second side storage container and may include a second external portion 134B. Both the first external portion 134A and the second external portion 134B may be located within a cover 136. In some embodiments, the cover 136, rather than the first external portion 134A and the second external portion 134B, may function as a conduit to exhaust the exhausted gas from the side storage containers 124 and 224. In other embodiments, the first external portion 134A and the second external portion 134B may pass through the interior of the side storage pod 120.

Figure 2A:
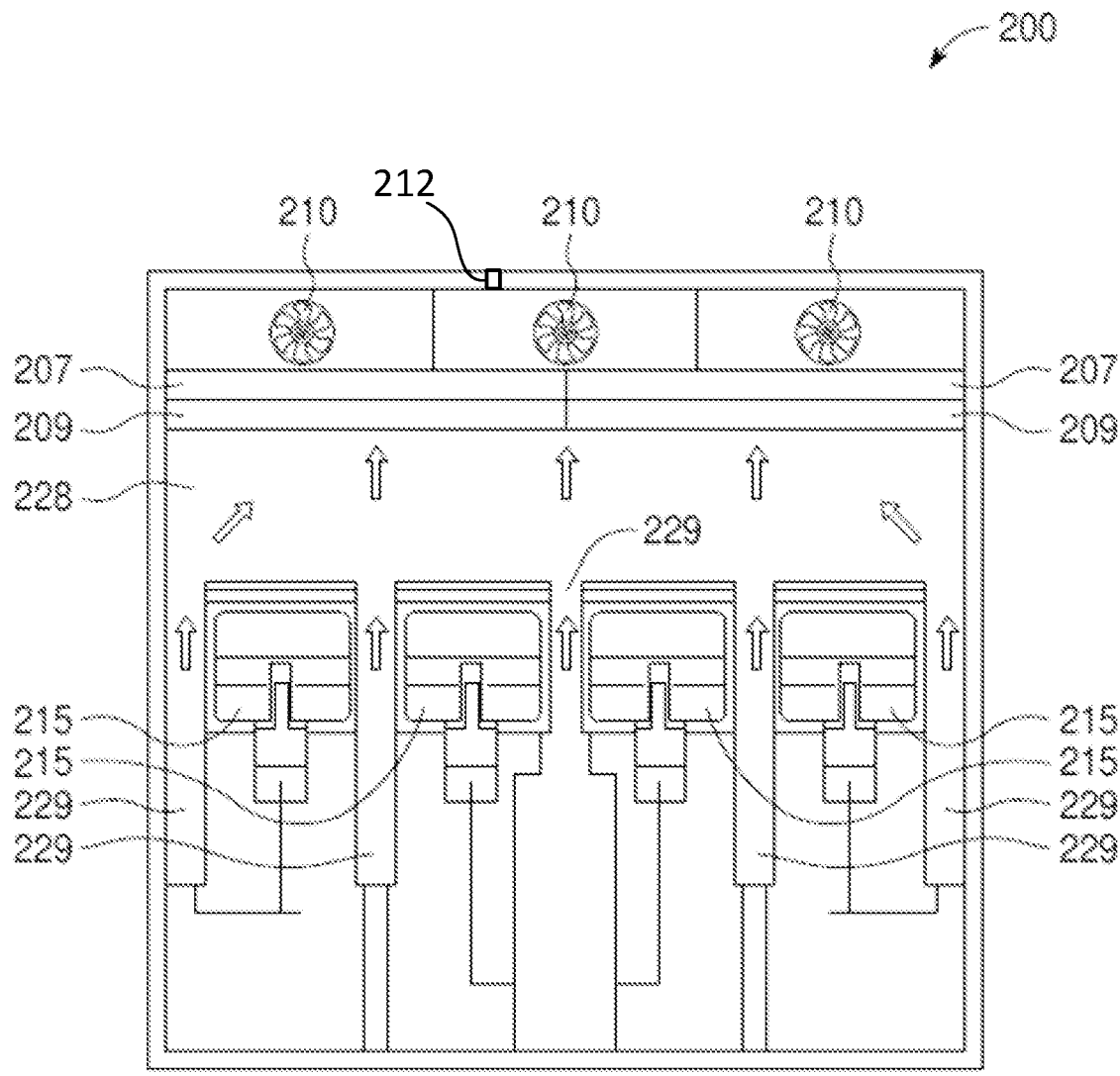
FIG. 2A illustrates a schematic front view of an EFEM according to one or more embodiments of the disclosure.
Figure 2B:
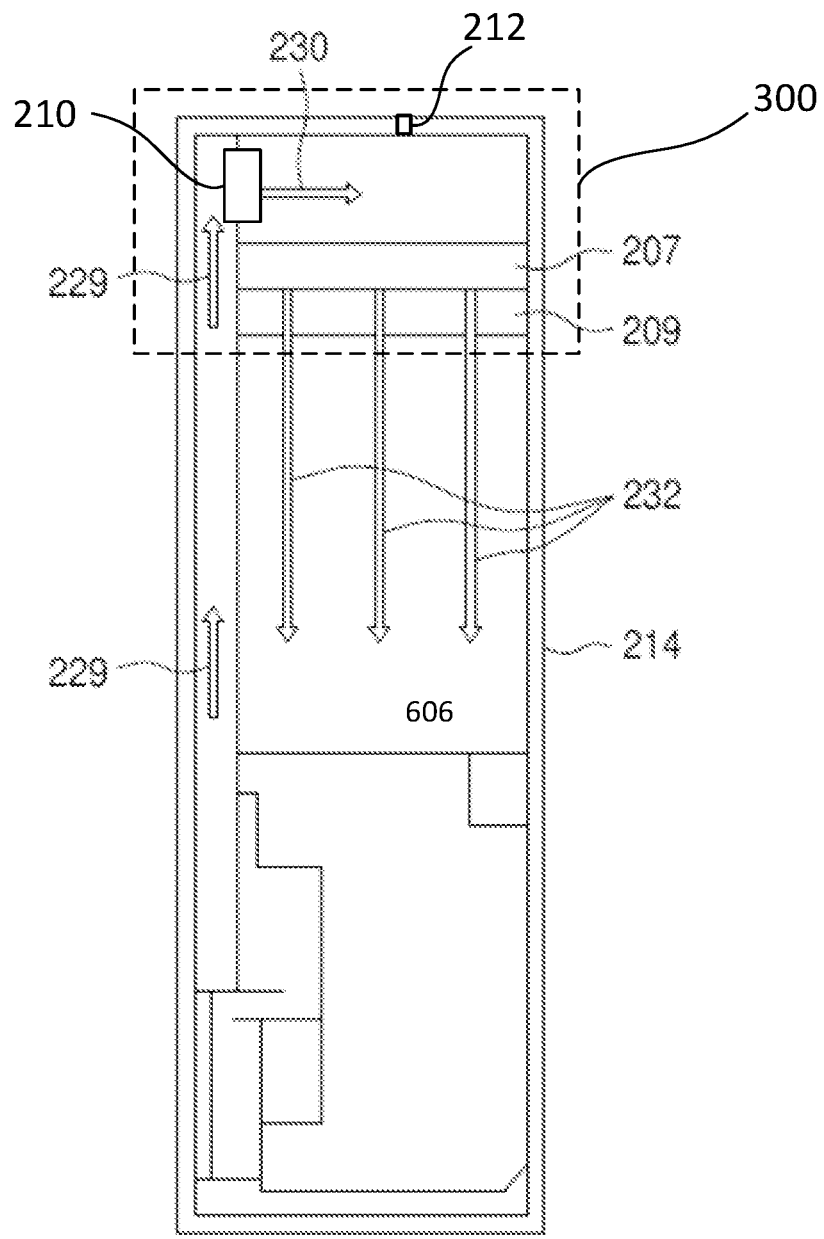
FIG. 2B illustrates a schematic side view of an EFEM according to one or more embodiments of the disclosure.

FIG. 2A illustrates a schematic front view of an electronic device manufacturing assembly according to one or more embodiments of the disclosure. FIG. 2B illustrates a schematic side view of an electronic device manufacturing assembly according to one or more embodiments of the disclosure.

An embodiment of an EFEM system suitable including an isolation gate according to embodiments herein is shown in FIGS. 2A and 2B. As with EFEM 114, substrates may be received into a transfer chamber (not shown) from EFEM 200, and may exit the transfer chamber to the EFEM 200, through a load lock apparatus (not shown), which is coupled to a wall of EFEM 200. The load lock apparatus may include one or more load lock chambers therein. Load lock chambers may be single wafer load lock (SWLL) chambers, multi-wafer chambers, or combinations thereof.

EFEM 200 may be an enclosure having various enclosure walls, such as, e.g., a front wall, a rear wall, two side walls, a top, and a bottom, forming an EFEM chamber 214. Each of the front, rear, and two side walls may have one or more interface openings to facilitate substrate exchange and/or coupling to other components. One or more load ports 215 may be provided on a wall of EFEM 200 as shown in FIG. 2A. The one or more load ports 215 may each be configured to receive and dock with a respective one or more substrate carrier (e.g., a FOUP). Although four load ports 215 are shown, other embodiments may have more or fewer load ports 215 suitable for docking a respective number of substrate carriers at the EFEM 200.

In the embodiment shown, the EFEM chamber 214 may be provided with environmental controls providing an environmentally-controlled atmosphere therein. In particular, an environmental control apparatus (not shown) may be coupled to the EFEM 200 and may be operational to monitor and/or control environmental conditions within the EFEM chamber 214. In some embodiments, the EFEM chamber 214 may receive a purge gas (e.g., an inert and/or non-reactive gas) therein, such as, e.g., argon (Ar), nitrogen ($N_2$), helium (He), clean dry air, or extreme clean dry air (xCDA) from purge gas supply. The environmental control system may control at least one of: 1) relative humidity (RH), 2) temperature (T), 3) an amount of oxygen ($O_2$), and/or 4) an amount of purge gas, within the EFEM chamber 214. Other environmental conditions of the EFEM 200 may be monitored and/or controlled, such as gas flow rate into the EFEM chamber 214, or pressure within the EFEM chamber 214, or both.

In some embodiments, the environmental control system includes a controller (not shown). The controller may include a suitable processor, memory, and electronic components for receiving inputs from various sensors and for controlling one or more valves to control the environmental conditions within the EFEM chamber 214. The environmental control system may, in one or more embodiments, monitor relative humidity (RH) by sensing RH in the EFEM 214 with a sensor. Any suitable type of sensor that measures relative humidity may be used, such as a capacitive-type sensor. The RH may be lowered by flowing a suitable amount of purge gas from the purge gas supply of the environmental control system into the EFEM chamber 214. In some embodiments, compressed bulk inert gases having low $H_2O$ levels (e.g., purity ≥99.9995%, $H_2O$≤5 ppm) may be used as the purge gas supply in the environmental control system. Other suitably low $H_2O$ levels may be used.

In another aspect, the sensor may measure a plurality of environmental conditions. For example, in some embodiments, the sensor may measure the relative humidity value as discussed above. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device manufacturing assembly 100 or particular substrates exposed to the environment of the EFEM 214.

The environmental control system may also measure a level of oxygen ($O_2$) within the EFEM 214. In some embodiments, a control signal from the controller to the environmental control apparatus initiating a flow of a suitable amount of purge gas from the purge gas supply into the EFEM chamber 214 may take place to control the level of oxygen ($O_2$) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device manufacturing assembly 100 or particular substrates exposed to the environment of the EFEM 200. In some embodiments, the sensor may sense the level of oxygen in the EFEM chamber 214 to ensure it is above a safe threshold level to allow entry into the EFEM chamber 214.

The sensor may further measure the absolute or relative pressure within the EFEM 200. In some embodiments, the controller may control the amount of flow of purge gas from the purge gas supply into the EFEM chamber 214 to control the pressure in the EFEM chamber 214.

The controller may include a processor, memory, and peripheral components configured to receive control inputs (e.g., relative humidity and/or oxygen) from the sensor and to execute a closed loop or other suitable control scheme. In one embodiment, the control scheme may change a flow rate of the purge gas being introduced into the EFEM 200 to achieve a predetermined environmental condition therein. In another embodiment, the control scheme may determine when to transfer substrates into the EFEM 200 or when to open the door of the substrate carrier.

Chemical and particle filters 207, 209, respectively, within EFEM 200 can be isolated with an isolation gate anywhere within the recirculation ducting 228, 229. As shown in FIG. 2A, gas may flow through the ducting toward the filter media using one or more fan systems 210. In some embodiments, the filters may be isolated in the return path (e.g., ducting 229) to maintain dry filter media. A gas inlet 212 (e.g., of plenum 230) may be configured to receive a low RH inert purge gas to displace ambient air with high RH gas during a service event or installation. In some embodiments, during normal operation of the EFEM 200, the purge gas may be recirculated during the service to reduce consumables. As shown in FIG. 2B, gas may flow up through ducting 228, 229. The gas may enter a plenum 230 above chemical and particle filters 207, 209. The fan units 210 may pull the recirculated gas and force the gas through filters 207, 209 so that it flows down 232 into the EFEM chamber 214.

The EFEM chamber and/or upper plenum of the EFEM may include doors or panels that can be opened up or removed to provide access to an interior of the EFEM chamber and/or upper plenum. The EFEM may undergo periodic maintenance, during which the EFEM chamber and/or upper plenum may be exposed to an ambient environment.

Figure 3A:
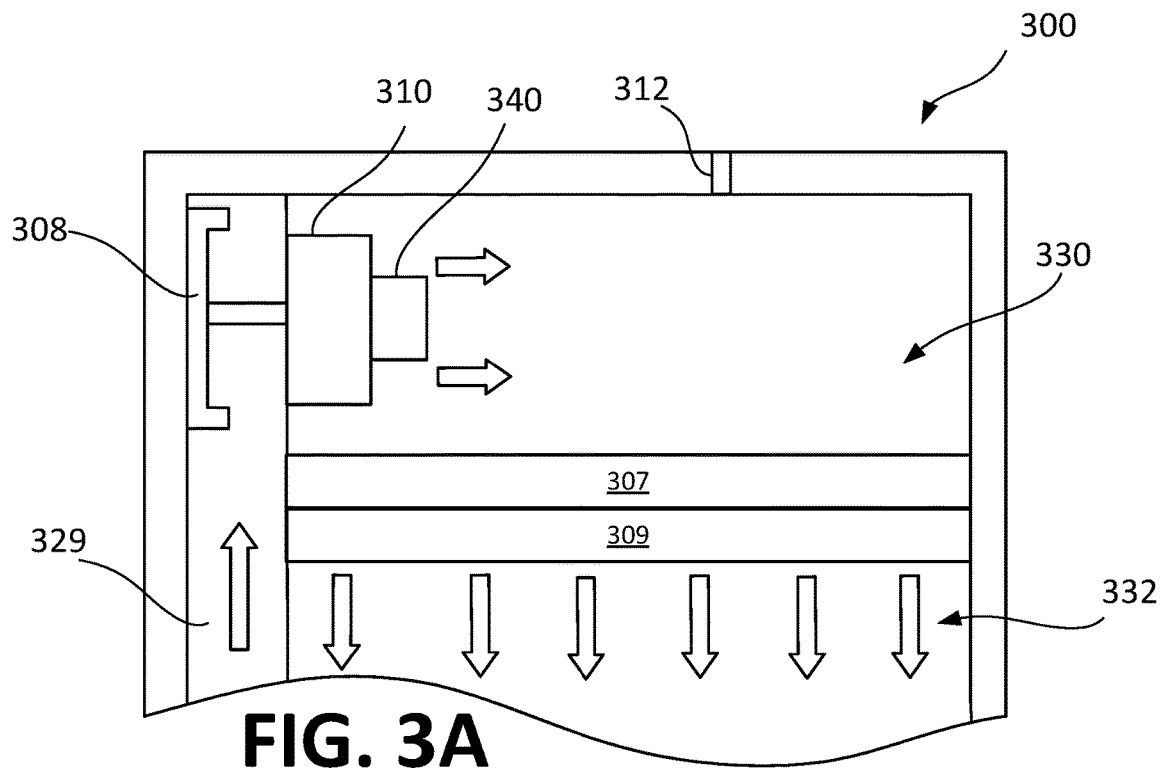
FIGS. 3A-3B illustrate schematic side views of an upper plenum system of an EFEM according to one or more embodiments of the disclosure.
Figure 3B:
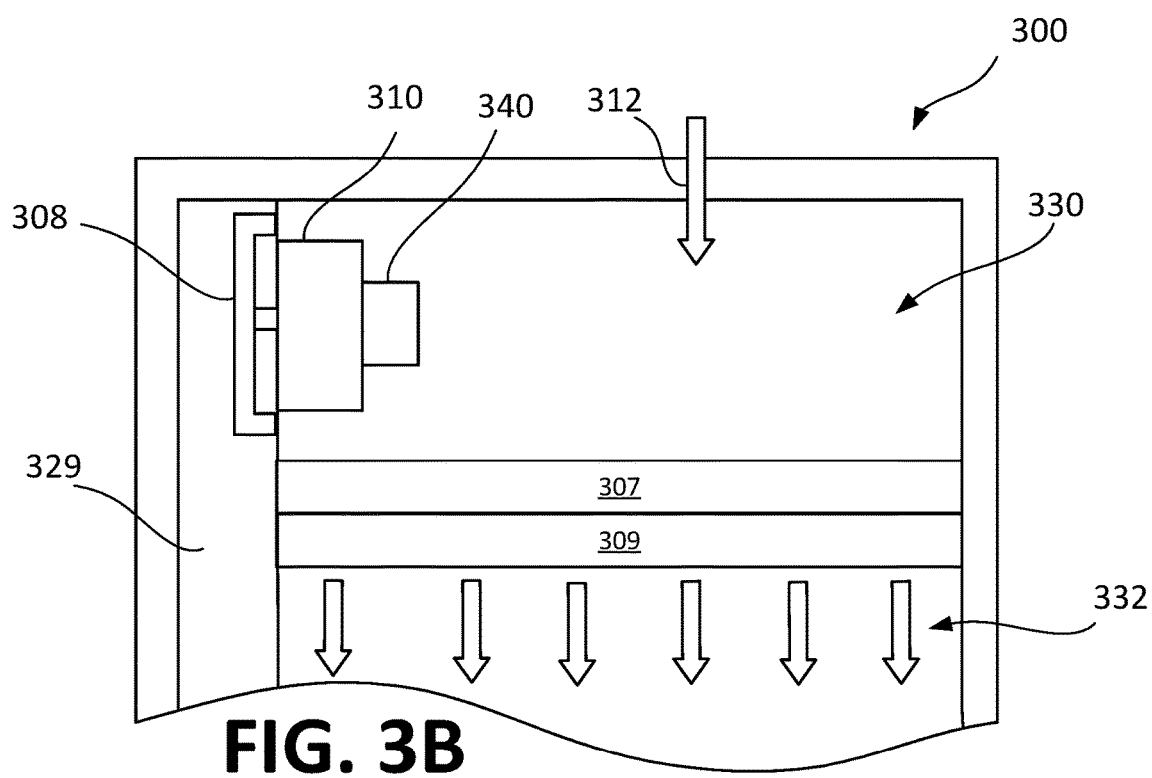

FIGS. 3A-3B illustrate schematic side views of an upper plenum system of an EFEM according to one or more embodiments of the disclosure. FIG. 3A illustrates the upper plenum system 300 having an isolation gate 308 in an open position, and FIG. 3B illustrates the upper plenum system 300 having the isolation gate 308 in a closed position.

In some embodiments, as shown in FIG. 3A, gas may flow from the EFEM chamber (e.g., EFEM substrate transfer chamber) located substantially below the upper plenum 330 through ducting 329 (e.g., ducting 228, 229 of FIG. 2A) back towards the upper plenum 330. When the isolation gate 308 is in the open position, the gas can move via one or more openings (e.g., by one or more fans 310 disposed proximate each of the openings) into the upper plenum 330. The isolation gate 308 may be open during normal operation of the EFEM. In some embodiments, an actuator 340 can move isolation gate 308 between an open position and a closed position. In some embodiments, the actuator 340 is a pneumatic actuator. Alternatively, the actuator may be an electronic actuator, a magnetic actuator, or other type of actuator. In the case of a pneumatic actuator, the actuator 340 may actuate responsive to receiving a supply of gas or fluid. In some examples, the actuator 340 receives a same type of gas as the purge gas described below (e.g., inert gas, CDA, etc.). In some embodiments, the actuator 340 is a linear actuator. While the isolation gate 308 is in the open position, the gas moved into the upper plenum 330 (e.g., by the fan 310) may pass through chemical filter 307 and/or particle filter 309 and into the EFEM chamber 332. The gas may be recirculated via the ducting 329 and fan 310 so long as the isolation gate 308 is in the open position.

Referring to FIG. 3B, in some embodiments, responsive to the EFEM chamber 332 being opened to the ambient environment (e.g., for servicing), the isolation gate 308 may be closed. In some embodiments, actuator 340 actuates the isolation gate 308 to a closed position. While in the closed position, the isolation gate 308 may block the flow of gas through the fan 310. In some embodiments, the isolation gate 308 seals the fan opening so that no gas can pass into or out of the upper plenum 330 via the fan 310. In some embodiments, the isolation gate 308 may block the flow of gas through the ducting 329. In some examples, the isolation gate 308 is substantially disposed within the ducting 329.

In some embodiments, a controller (not illustrated) may control the actuation of the isolation gate 308. The controller may receive sensor data from one or more sensors, responsive to which the controller may cause the actuator 340 to open or close the isolation gate. In some examples, the controller receives sensor data from a door sensor that detects when a maintenance door of the EFEM chamber is open. The controller may cause the isolation gate 308 to be closed responsive to the door sensor detecting that the maintenance door is open. In some embodiments, the controller receives sensor data from a humidity sensor, an oxygen ($O_2$) sensor, and/or one or more other environmental sensors that detect a condition within the EFEM chamber. The controller may cause the initiation of an isolation protocol responsive to sensor data indicating a trigger condition. The initiation protocol may include the closing of the isolation gate 308. For example, the controller may cause the isolation gate 308 to be closed responsive to receiving sensor data indicating that the relative humidity inside the EFEM chamber exceeds a threshold humidity condition. In another example, the controller may cause the isolation gate 308 to be closed responsive to receiving sensor data indicating that the level of oxygen inside the EFEM chamber exceeds a threshold oxygen condition. The controller may cause purge gas to be supplied via opening 312 responsive to the isolation gate 308 being closed, as explained herein below. In some embodiments, the isolation gate 308 can be manually actuated (e.g., by a technician, etc.).

A flow of purge gas may be supplied to the upper plenum 330 via an opening 312. The purge gas may be blocked from flowing through the ducting 329 by the isolation gate 308. In some embodiments, the purge gas is a low RH gas as described herein above. For example, the purge gas may be CDA. The purge gas may be supplied to the upper plenum 330 at an elevated pressure. In some examples, the purge gas is supplied via the opening 312 at a pressure higher than 10 pounds per square inch (PSI). In some examples, the purge gas is supplied at greater than 20 PSI, greater than 30 PSI, or greater than 50 PSI. The supply of purge gas may induce a positive pressure within the upper plenum 330. The closed isolation gate 308 may seal the ducting 329 from the purge gas (e.g., under positive pressure in the upper plenum 330), causing the purge gas to pass through the chemical filter 307 and/or particle filter 309 and into the EFEM chamber 332. By causing the purge gas to pass through the chemical filter 307 and/or particle filter 309, moisture in the ambient air may be prevented from accumulating in or on the chemical filter 307 and/or particle filter 309 when the EFEM chamber 332 is open to the ambient environment. In some embodiments, the supply of purge gas can be controlled (e.g., increased and/or decreased) to modulate noise in the EFEM chamber 332. In some examples, decreasing the flow and/or pressure of the supply of purge gas may reduce noise inside the EFEM chamber 332 below a threshold noise level.

Figure 4B:
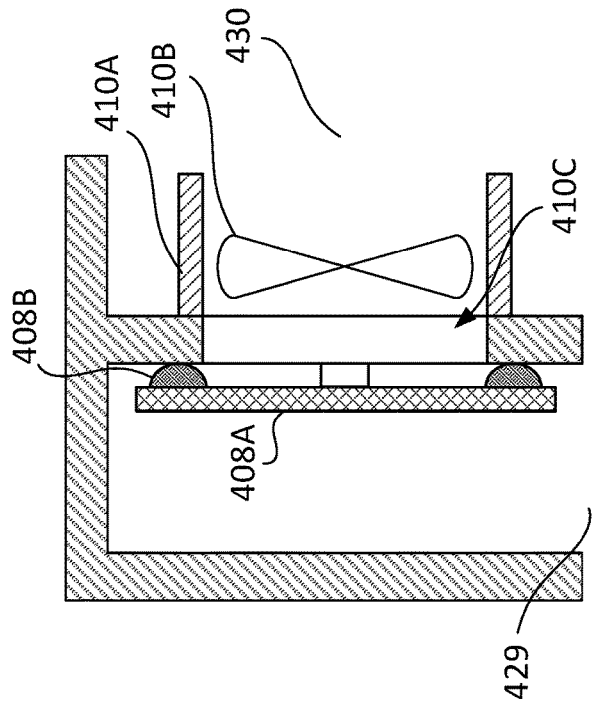
FIGS. 4A-4B illustrate schematic cutaway partial views of an isolation gate and upper plenum of an EFEM according to one or more embodiments of the disclosure.
Figure 4A:
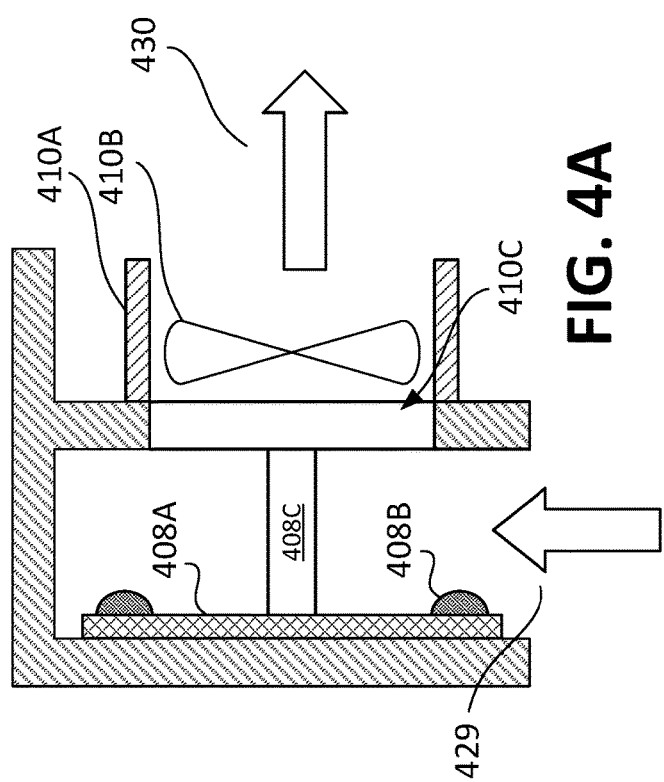
Figure 4C:
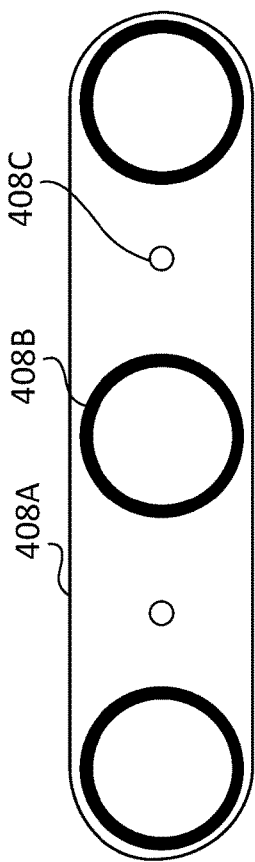
FIG. 4C illustrates a schematic view of an isolation gate of an EFEM according to one or more embodiments of the disclosure.

FIGS. 4A-4B illustrate schematic cutaway partial views of an isolation gate and upper plenum of an EFEM according to one or more embodiments of the disclosure. FIG. 4C illustrates a schematic view of an isolation gate of an EFEM according to one or more embodiments of the disclosure. In some embodiments, an isolation gate 408 includes a plate 408A, one or more gaskets (e.g., seals 408B) attached to the plate 408A, and a support 408C attached to the plate 408A. In some embodiments, the support 408C is coupled to an actuator (e.g., actuator 340 of FIGS. 3A and 3B). The support 408C may support the isolation gate 408 laterally and/or vertically in space. In some embodiments, the support 408C pushes and/or pulls the isolation gate 408 between an open position (e.g., illustrated in FIG. 4A) and a closed position (e.g., illustrated in FIG. 4C). In some embodiments, the isolation gate 408 includes multiple supports. In some examples, the isolation gate 408 includes first supports for supporting the isolation gate 408 in a vertical direction (e.g., one or more guide rails), and/or second supports for supporting the isolation gate 408 in a lateral direction. In some examples, the isolation gate 408 is configured to be supported by one or more supports and is configured to be coupled to a linkage for actuating the isolation gate 408 between an open position and a closed position.

Referring to FIG. 4A, the isolation gate 408 may be shown in an open position. In some embodiments, when the isolation gate 408 is in an open position, gas can recirculate (e.g., from the EFEM chamber) through one or more ducts 429 to the upper plenum 430. In some embodiments, the gas is flowed by a fan 410. In some examples, the gas can flow through a fan opening 410C (e.g., an opening in the sidewall of the upper plenum 430), past fan blades 410B, and may be directed into the upper plenum by a fan shroud 410A.

Referring to FIG. 4B, the isolation gate 408 may be shown in a closed position. In some embodiments, when the EFEM chamber is opened to the ambient environment (e.g., a door to the EFEM chamber is opened to the external environment), the isolation gate 408 may be closed. In some embodiments, one or more actuators (e.g., pneumatic actuators) may close the isolation gate 408 responsive to the EFEM chamber being opened. A supply of gas (e.g., purge gas, CDA, low-humidity air, etc.) may be provided to the upper plenum (e.g., via gas inlet 212 of FIG. 2 or opening 312 of FIG. 3). The isolation gate 408 may be closed (e.g., actuated to a closed position) so that the gas cannot flow through the fan opening 410C and through the ducts 429 (e.g., the gas is blocked from flowing from the upper plenum to the EFEM chamber via the fan opening 410C). In some embodiments, closing the isolation gate 408 causes the supply of gas to flow from the upper plenum through one or more filters (e.g., filters 307, 309 of FIGS. 3A and 3B, filters 207, 209 of FIGS. 2A and 2B) to the EFEM chamber. The gas caused to flow through the one or more filters when the isolation gate 408 is closed and the gas supplied to the upper plenum 430 may functionally isolate the one or more filters from the ambient environment when the EFEM chamber is opened.

In some embodiments, responsive to the isolation gate 408 being actuated to the closed position, the seal 408B may engage a surface proximate the peripheral edge of the fan opening 410C. In some embodiments, the seal 408B may deform responsive to a force applied (e.g., by the actuator via the plate 408A and/or support 408C). In some embodiments, the seal 408B may have a D-shaped cross section. In other embodiments, the seal 408B may have a substantially square-shaped cross section. In other embodiments, the seal 408B may have a circular cross-section or a half-circular-shaped cross-section. Other cross-section shapes are possible. The seal 408B may be hollow. In some embodiments, the seal 408B is made of a polymer. For example, the seal 408B may be comprised of (e.g., made of) a closed cell foam rubber material. In some embodiments, the seal 408B is made of a chemical-resistant material (e.g., a corrosion-resistant material, etc.).

In some embodiments, the seal 408B is attached to the plate 408A. In some examples, the seal 408B may be attached to the plate 408A by an adhesive and/or by one or more fasteners and/or clamp mechanisms. In some embodiments, the isolation gate 408 includes multiple seals 408B each corresponding to a fan opening of the EFEM. In some examples, such as illustrated in FIG. 4C, the isolation gate 408 may include three seals 408B. However, in other examples, the isolation gate 408 may include five seals 408B or any other number of seals, with each seal corresponding to a fan opening 410C. In some embodiments, to prevent bending, the plate 408A may include one or more stiffening features. In some examples, the plate 408A may include a stiffener attached to the back of the plate 408A. In some examples, the plate 408A may include structural features to increase the area moment of inertia of the cross section of the plate 408A. The stiffener and/or structural feature included by the plate 408A in some embodiments may aid the plate 408A to resist bending under load (e.g., under load from forces applied by an actuator to seal the fan openings 410C). In some embodiments, the plate 408A may be made of (e.g., comprised of) a material such as stainless steel, carbon steel, aluminum, and/or chromium. In some embodiments, the plate 408A may include a protective coating on at least a portion of a surfaced of the plate 408A. In some examples, the plate 408A includes an anodization coating. The protective coating may be a corrosion-resistant coating. The plate 408A may be configured to couple to one or more actuators (e.g., actuator 340 of FIGS. 3A and 3B) via the supports 408C.

Figure 5:
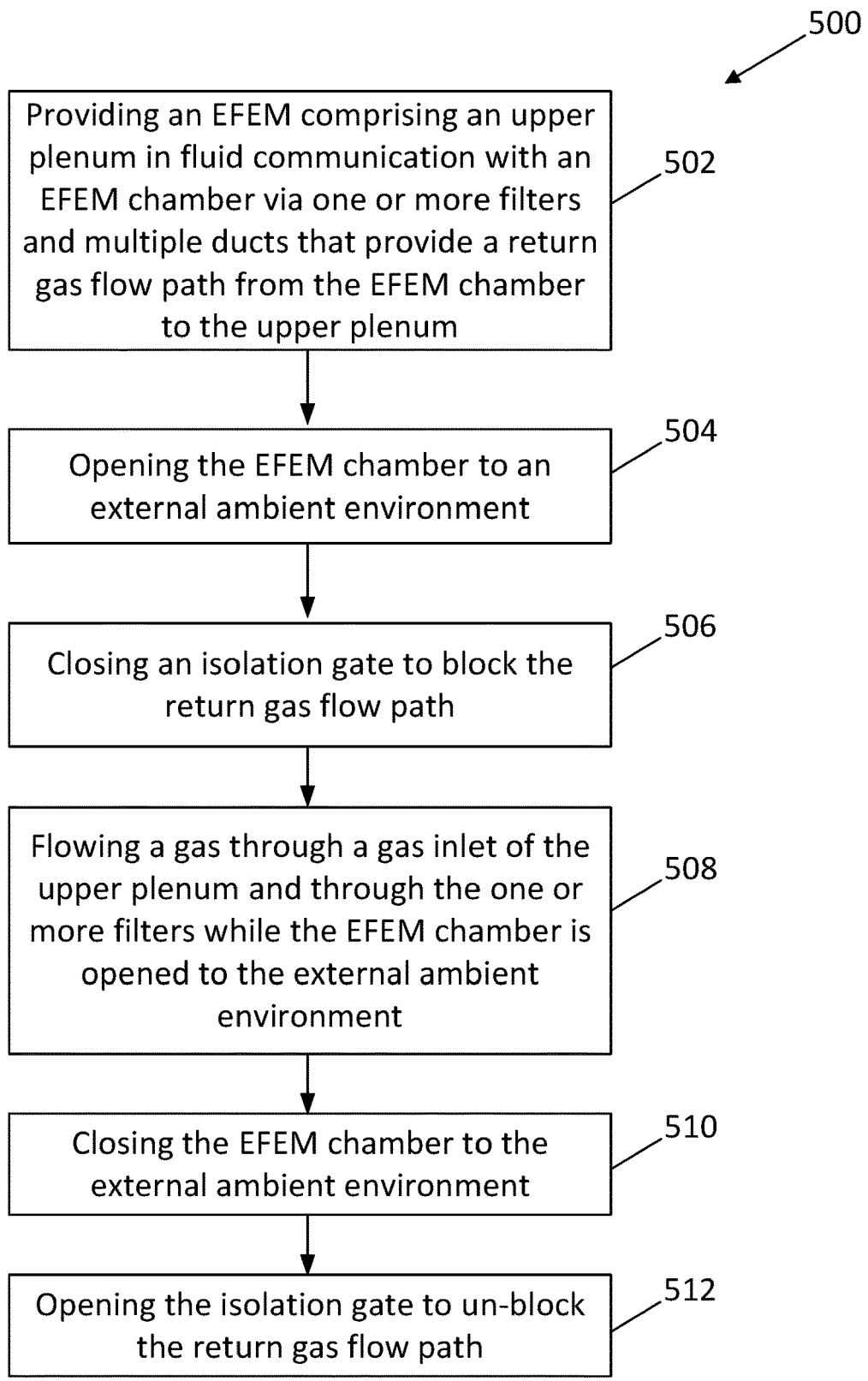
FIG. 5 illustrates a method of using an EFEM with an isolation gate according to one or more embodiments described herein.

FIG. 5 illustrates a method 500 of servicing an EFEM with an isolation gate according to one or more embodiments described herein. At block 502, the method includes providing an EFEM. The EFEM may include inter alia an upper plenum in fluid communication with an EFEM chamber via one or more filters. The EFEM may further include inter alia a plurality of ducts that provide a return gas flow path which enable recirculation of gas from the EFEM chamber to the upper plenum. In one or more embodiments, the EFEM is taken offline to perform a service event or is offline for an initial installation and/or startup.

At block 504, embodiments of method 500 include opening the EFEM chamber to an external ambient environment. For example, a door to the EFEM chamber may be opened exposing the internal components to the ambient environment. The ambient environment typically contains air at a relative humidity higher than the target RH for operation within the EFEM.

At block 506, method 500 includes closing an isolation gate to block the return gas flow path formed by the plurality of ducts. In some embodiments, the isolation gate may be closed by one or more actuators coupled to the isolation gate. According to one or more embodiments, when in the closed position, the isolation gate may seal one or more openings of the upper plenum (e.g., fan openings) to prevent flow of gas through the openings.

At block 508, method 500 includes flowing a low RH purge gas through a gas inlet of the upper plenum and through the one or more filters while the EFEM chamber is opened to the external ambient environment. The low RH purge gas may be pressurized to provide a positive flow rate of purge gas through the one or more filters. A positive pressure may be generated inside the upper plenum by the supply of purge gas. The isolation gate may block the supply of gas from flowing through ducting used for recirculation of gas while the EFEM is in operation (e.g., the return gas flow path). While the internal components of the EFEM chamber are being accessed, the purge gas flows through the filter media preventing moisture from the ambient environment from being absorbed by the one or more filters. The purge gas flow continues until completion of the service work. The low RH inert gas may be the same as the low RH inter gas used during operation of the EFEM or it may be a different gas at a different RH that is lower than the RH of the ambient environment.

At block 510, method 500 includes closing the EFEM chamber. Once the EFEM chamber is closed, the EFEM is started up to return to its target operating conditions. Having isolated the one or more filters from the high RH ambient environment, the EFEM can become operational again in less than about 7 hours, less than about 6 hours, less than about 5 hours, less than about 4 hours, less than about 3 hours, or any individual value or sub-range within these ranges.

At block 512, the method 500 includes opening the isolation gate to un-block the return gas flow path. The isolation gate may be opened by the one or more actuators. Upon opening of the isolation gate, gas may be recirculated through the ducting from the EFEM chamber to the upper plenum.

A comparison of system service events at baseline was performed with respect to equipment using filter isolation according to one or more embodiments herein. In one example, the EFEM system was opened and exposed to ambient humidity for predetermined time intervals and the time to return to operating control mode levels was measured. In a second example, the filters were isolated according to at least one embodiment herein and the system was exposed to ambient humidity for the same predetermined time intervals. The time to return to operating control mode levels was measured.

Systems and methods as described herein substantially reduced the startup time for the EFEM as compared to convention EFEMs. For example, if the door to a conventional EFEM chamber is opened to expose the internal components and filter media to external air at an RH of about 30% to about 40% for about 30 minutes, the time it would take to restart the EFEM and bring down the RH of the gas to a target of less than about 1% would be about 8 hours to about 12 hours, or about 8.5 hours to about 10 hours or any individual value or sub-range within these ranges. In contrast, an EFEM and associated methods of use according to one or more embodiments described herein, wherein the filters are isolated during a 30 minute service and purged with a low RH gas, the time it would take to restart the EFEM and bring down the RH of the gas to a target of less than about 1% would be about 3 hours to about 7 hours, or about 4 hours to about 6 hours, or 6 hours, or any individual value or sub-range within these ranges. In some embodiments, an EFEM and associated methods according to embodiments herein reduce the time it takes to restart the EFEM after a services by about 12.5% to about 75%, about 15% to about 62.5%, about 25% to about 50%, or any individual value or sub-range within these ranges. In some embodiments, if the service is two hours, then the restart of the inventive EFEM as compared to a conventional EFEM is about 40% faster. Reducing startup time by about half, for example, can bring production systems back online more quickly, which can increase revenue and reduce costs.

Reference throughout this specification to, for example, "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a robot arm" includes a single robot arm as well as more than one robot arm.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content.

The foregoing description discloses example embodiments of the disclosure. Modifications of the above-disclosed assemblies, apparatus, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the following claims.

What is claimed is:

1. An equipment front end module (EFEM), comprising:
an EFEM chamber formed between a plurality of walls of the EFEM;
an upper plenum above the EFEM chamber, the upper plenum in fluid communication with the EFEM chamber;
a plurality of ducts that provide a return gas flow path enabling recirculation of gas from the EFEM chamber to the upper plenum;
one or more filters that separate the upper plenum from the EFEM chamber;
one or more fan openings along the return gas flow path between the plurality of ducts and the upper plenum;
one or more fans disposed proximate each of the one or more fan openings; and
an isolation gate configured to block the one or more fan openings responsive to the isolation gate being actuated to a closed position, wherein while the isolation gate is in the closed position the one or more filters are isolated from an ambient environment responsive to a gas being flowed through the upper plenum when the EFEM chamber is opened to the ambient environment.

2. The EFEM of claim 1, further comprising:
one or more actuators configured to actuate the isolation gate between an open position and the closed position.

3. The EFEM of claim 2, wherein the one or more actuators are pneumatic actuators.

4. The EFEM of claim 1, wherein the gas is a purge gas, and wherein the upper plenum comprises a gas inlet configured to receive the purge gas.

5. The EFEM of claim 4, wherein the EFEM is configured to flow the purge gas from the upper plenum through the one or more filters to the EFEM chamber to achieve a positive pressure in the upper plenum.

6. The EFEM of claim 1, wherein the isolation gate comprises one or more gaskets to seal the plurality of ducts.

7. The EFEM of claim 6, wherein the one or more gaskets are comprised of a closed cell foam rubber material.

8. The EFEM of claim 1, wherein the isolation gate is configured to seal the one or more fan openings at a peripheral edge of the one or more fan openings.

9. The EFEM of claim 1, wherein the one or more fans are configured to recirculate gas from the EFEM chamber to the upper plenum via the plurality of ducts and the one or more fan openings.

10. The EFEM of claim 1, wherein the isolation gate is comprised of stainless steel, aluminum, carbon steel, chromium, or combinations thereof.

11. The EFEM of claim 10, wherein the isolation gate comprises a protective coating.

12. A method of servicing an equipment front end module (EFEM), comprising:
providing the EFEM comprising:
an upper plenum in fluid communication with an EFEM chamber via one or more filters;
a plurality of ducts that provide a return gas flow path enabling recirculation of gas from the EFEM chamber to the upper plenum;
one or more fan openings along the return gas flow path between the plurality of ducts and the upper plenum; and
one or more fans disposed proximate each of the one or more fan openings;
opening the EFEM chamber to an external ambient environment;
closing an isolation gate to block the one or more fan openings;
flowing a gas through a gas inlet of the upper plenum and through the one or more filters while the EFEM chamber is opened to the external ambient environment, preventing moisture from the ambient environment from being absorbed by the one or more filters;
closing the EFEM chamber to the external ambient environment; and
opening the isolation gate to un-block the one or more fan openings.

13. The method of claim 12, further comprising generating a positive pressure inside the upper plenum responsive to flowing the gas through the gas inlet.

14. The method of claim 12, wherein the gas is blocked from flowing from the upper plenum through the plurality of ducts to the EFEM chamber by the isolation gate when the isolation gate is in a closed position.

15. The method of claim 12, wherein the external ambient environment comprises a gas with a first relative humidity that is about 30 to 40 times higher than a second relative humidity of the EFEM chamber during operation of the EFEM.

16. The method of claim 12, wherein the gas comprises a purge gas.

17. The method of claim 16, wherein the purge gas comprises clean dry air (CDA).

18. An isolation gate of an equipment front end module (EFEM), comprising:
a body having dimensions that approximately correspond to dimensions of a sidewall of an upper plenum of the EFEM; and
multiple seals coupled to a side of the body, wherein each of the multiple seals are configured to seal a corresponding fan opening in the sidewall of the upper plenum at a peripheral edge of the corresponding fan opening,
wherein the isolation gate is configured to block a return gas flow path of the EFEM responsive to the isolation gate being actuated to a closed position in the EFEM.

19. The isolation gate of claim 18, wherein the isolation gate is further configured to couple to one or more actuators to actuate the isolation gate between an open position and the closed position.

20. The isolation gate of claim 18, wherein the body is comprised of stainless steel, aluminum, carbon steel, chromium, or combinations thereof.

* * * * *